(12) United States Patent
Hirai et al.

(10) Patent No.: US 10,164,134 B2
(45) Date of Patent: Dec. 25, 2018

(54) OPTOELECTRONIC SEMICONDUCTOR CHIP

(71) Applicant: OSRAM Opto Semiconductors GmbH, Regensburg (DE)

(72) Inventors: Asako Hirai, Regensburg (DE); Tobias Meyer, Regensburg (DE); Philipp Drechsel, Regensburg (DE); Peter Stauß, Regensburg (DE); Anna Nirschl, Regenstauf (DE); Alvaro Gomez-Iglesias, Regensburg (DE); Tobias Niebling, Regensburg (DE); Bastian Galler, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/557,600

(22) PCT Filed: Mar. 29, 2016

(86) PCT No.: PCT/EP2016/056794
§ 371 (c)(1),
(2) Date: Sep. 12, 2017

(87) PCT Pub. No.: WO2016/156312
PCT Pub. Date: Oct. 6, 2016

(65) Prior Publication Data
US 2018/0062031 A1  Mar. 1, 2018

(30) Foreign Application Priority Data
Mar. 27, 2015 (DE) .................. 10 2015 104 700

(51) Int. Cl.
*H01L 31/0352* (2006.01)
*H01L 29/15* (2006.01)
*H01L 33/06* (2010.01)

(52) U.S. Cl.
CPC ........ *H01L 31/0352* (2013.01); *H01L 29/151* (2013.01); *H01L 29/152* (2013.01); *H01L 31/035236* (2013.01); *H01L 33/06* (2013.01)

(58) Field of Classification Search
CPC ..... H01L 33/06; H01L 29/151; H01L 29/152; H01L 31/035236; H01L 31/0352
See application file for complete search history.

(56) References Cited

U.S. PATENT DOCUMENTS 6,285,698 B1   9/2001  Romano et al.
7,611,917 B2  11/2009  Emerson et al.
(Continued)

FOREIGN PATENT DOCUMENTS

DE  102011112706 A1  3/2013
DE  102012217640 A1  4/2014
(Continued)

OTHER PUBLICATIONS

Cho, H., et al., "Formation of V-Shaped Pits in Nitride Films Grown by Metalorganic Chemical Vapor Deposition," Journal of the Korean Physical Society, vol. 42, Feb. 2003, pp. S547-S550.
(Continued)

*Primary Examiner* — Fei Fei Yeung Lopez
(74) *Attorney, Agent, or Firm* — Slater Matsil, LLP

(57) ABSTRACT

An optoelectronic semiconductor chip is disclosed. In an embodiment the chip includes an active zone with a multi-quantum-well structure, wherein the multi-quantum-well structure comprises multiple quantum-well layers and multiple barrier layers, which are arranged sequentially in an alternating manner along a growth direction, wherein the multi-quantum-well structure has at least one emission region and multiple transport regions which are arranged sequentially in an alternating manner in a direction perpendicular to the growth direction, wherein at least one of the
(Continued)

quantum-well layers and the barrier layers are thinner in the transport regions than in the emission regions, and wherein the quantum-well layers in the transport regions and in the emission regions are oriented perpendicularly to the growth direction with exception of a junction region between adjacent transport regions and emission regions.

16 Claims, 8 Drawing Sheets

(56) References Cited

U.S. PATENT DOCUMENTS

| | | | |
|---|---|---|---|
| 8,026,117 B2 | 9/2011 | Kim et al. | |
| 8,030,640 B2 | 10/2011 | Oh et al. | |
| 8,684,749 B2 | 4/2014 | Lester et al. | |
| 9,059,353 B2 | 6/2015 | Katz et al. | |
| 9,502,611 B2 | 11/2016 | Leirer et al. | |
| 2010/0171135 A1 | 7/2010 | Engl et al. | |
| 2010/0244042 A1* | 9/2010 | Saito | H01L 33/24 257/76 |
| 2012/0168753 A1* | 7/2012 | Sanga | H01L 33/02 257/52 |
| 2013/0037779 A1 | 2/2013 | Takeoka et al. | |
| 2014/0225059 A1* | 8/2014 | Yang | H01L 33/145 257/13 |
| 2016/0380155 A1* | 12/2016 | Jeong | H01L 33/22 257/101 |

FOREIGN PATENT DOCUMENTS

| | | |
|---|---|---|
| JP | 2008218746 A | 9/2008 |
| WO | WO 00/59046 * | 10/2000 |
| WO | 2014048907 A1 | 4/2014 |

OTHER PUBLICATIONS

Laubsch, A., et al., "On the origin of IQE-'droop' in InGaN LEDs," Physica Status Solidi (C) Current Topics in Solid State Physics, vol. 6, Issue Suppl. 2, Jul. 2009, pp. S913-S916.

Peretti, J., et al., "Identification of Auger effect as the dominant mechanism for efficiency droop of LEDs," Proc. SPIE 9003, Light-Emitting Diodes: Materials, Devices, and Applications for Solid State Lighting XVIII, 90030Z, Feb. 27, 2014, pp. 1-14.

Van Der Laak, N., et al., "Role of gross well-width fluctuations in bright, green-emitting single InGaN/GaN quantum well structures," Applied Physics Letters, vol. 90, Issue 12, Mar. 2007, pp. 121911-1-121911-3.

* cited by examiner

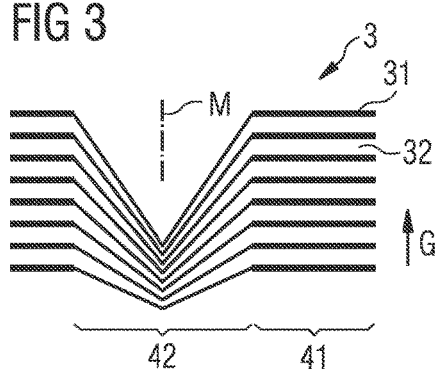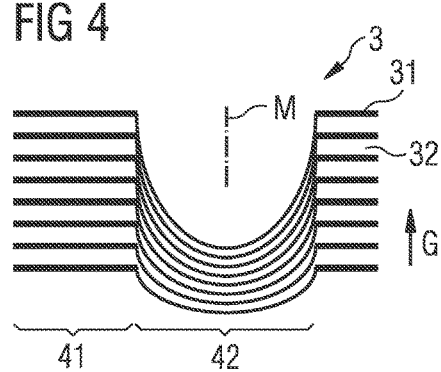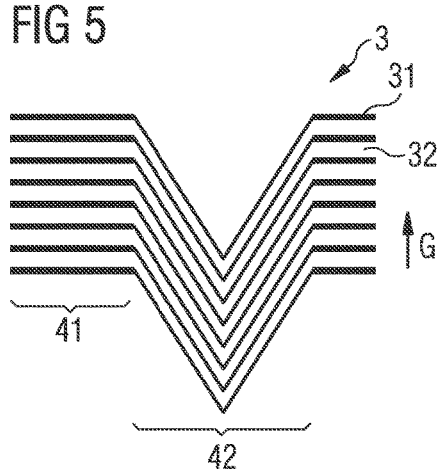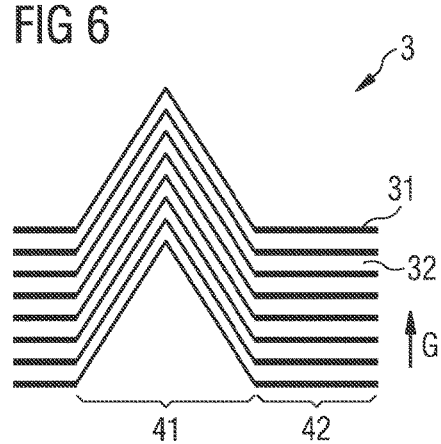

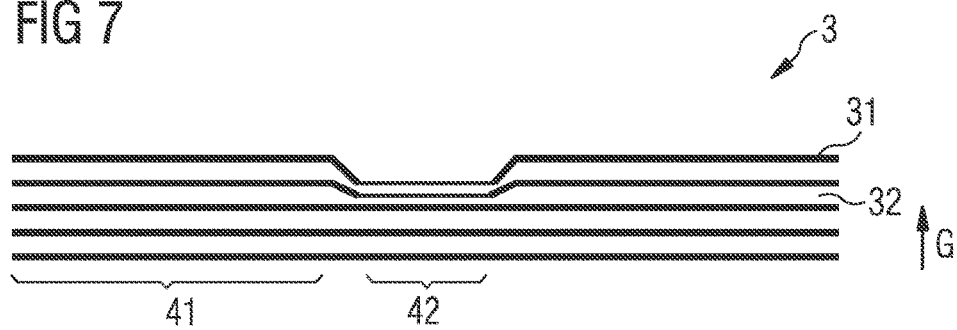
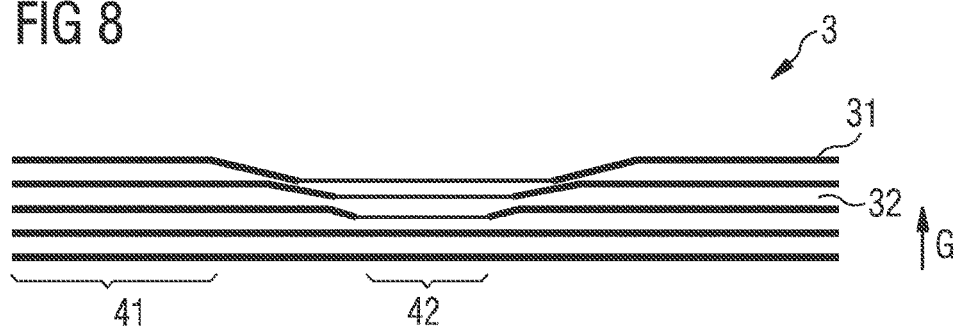
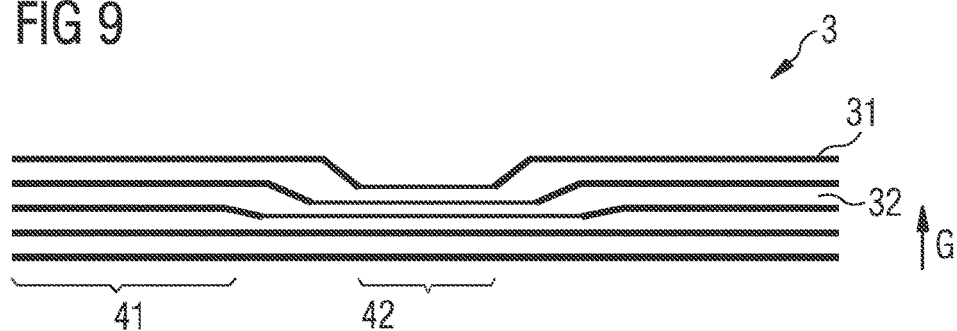

OPTOELECTRONIC SEMICONDUCTOR CHIP

This patent application is a national phase filing under section 371 of PCT/EP2016/056794, filed Mar. 29, 2016, which claims the priority of German patent application 10 2015 104 700.4, filed Mar. 27, 2015, each of which is incorporated herein by reference in its entirety.

TECHNICAL FIELD

The invention is related to an optoelectronic semiconductor chip.

SUMMARY OF THE INVENTION

According to at least one embodiment, the semiconductor chip has an active zone. The active zone contains a multi-quantum-well structure. In particular, the active zone is intended to generate electromagnetic radiation, in particular near-ultraviolet radiation, visible light or near-infrared radiation. The optoelectronic semiconductor chip is particularly preferably a light-emitting diode chip or a laser diode chip.

According to at least one embodiment, the multi-quantum-well structure contains multiple quantum-well layers and multiple barrier layers. The quantum-well layers and the barrier layers alternate with one another along a growth direction of a semiconductor layer sequence in which the multi-quantum-well structure is formed. In other words, an alternating sequence of the quantum-well layers and the barrier layers is present in the multi-quantum-well structure.

According to at least one embodiment, the quantum-well layers and/or the barrier layers extend over the entire multi-quantum-well structure continuously and preferably uninterruptedly without any gaps. This means in particular that, seen in a top view, each of the above-mentioned layers completely fills a base surface of the multi-quantum-well structure or at least one base surface of the multi-quantum-well structure which is intended for the generation of radiation when used as intended. The term "uninterruptedly" here does not rule out the possible presence of small holes caused by the production process, seen in a top view. These holes have a diameter of, e.g., no more than 50 nm or 15 nm and the proportion of surface area occupied by these holes, seen in a top view, is preferably less than 2% or 1%.

According to at least one embodiment, the multi-quantum-well structure is subdivided into at least one emission region and at least one transport region. Preferably, a plurality of transport regions and precisely one or more than one emission region(s) are present.

According to at least one embodiment, the emission regions and the transport regions alternate along a direction transverse or perpendicular to the growth direction, seen in a cross-section parallel to the growth direction. The fact that, seen in cross-section, the multi-quantum-well structure exhibits multiple emission regions does not rule out the presence of only a single, continuous emission region, seen in a top view. The emission regions can each extend through the entire multi-quantum-well structure in a direction parallel to the growth direction. This can mean that all the quantum-well layers generate radiation in the emission regions when operated as intended.

According to at least one embodiment, the quantum-well layers and/or the barrier layers are of thinner configuration in the transport regions or have a material composition there which is different from that in the emission regions. This makes it possible for improved charge carrier transport to be guaranteed in the transport regions, in particular improved transport of so-called holes compared with that in the emission regions. In other words, a thickness of the quantum-well layers and/or the barrier layers is preferably modulated along a direction perpendicular to the growth direction. The term thickness here preferably relates to an extension of the corresponding layer along a local normal to the layer, i.e., in a direction perpendicular to locally present main extension directions of the layer, in particular seen in a cross-section perpendicular to the layer.

In at least one embodiment, the optoelectronic semiconductor chip comprises an active zone having a multi-quantum-well structure. The multi-quantum-well structure contains multiple quantum-well layers and multiple barrier layers, which are arranged sequentially in an alternating manner along a growth direction of the multi-quantum-well structure and which each extend continuously over the entire multi-quantum-well structure or at least over a region of the multi-quantum-well structure intended for generating radiation. Seen in a cross-section parallel to the growth direction, the multi-quantum-well structure has at least one emission region and multiple transport regions, which are arranged sequentially in an alternating manner in a direction perpendicular to the growth direction. The quantum-well layers and/or the barrier layers are of thinner configuration in the transport regions or have a material composition there which is different from that in the emission regions.

Conventionally, an active zone has a multi-quantum-well structure, also known as a multiple quantum well or MQW, in which quantum-well layers have a homogeneous thickness in a plane perpendicular to a growth direction. In a multi-quantum-well structure of this type, it is comparatively difficult to inject holes into those quantum-well layers that are further away from a p-type side of a semiconductor layer sequence. To improve hole injection, it is possible to select thinner barrier layers. However, thinner barrier layers require a greater proportion of indium in the quantum-well layers in order to achieve the desired emission wavelength. Associated with this, the quality of the quantum-well layers can deteriorate and degradation over time can also occur to a greater degree.

For the production of high-efficiency LEDs, it is necessary to distribute the charge carriers in the quantum-well layers as homogeneously as possible to avoid both losses due to non-radiative Auger recombination and an overflow of charge carriers. In the semiconductor chip described here, it is possible to use comparatively thick barrier layers in the emission regions and to retain a relatively low indium content in the quantum-well layers while at the same time ensuring that holes are pushed efficiently into quantum-well layers located further away from a p-type side by means of the fact that the transport regions are separated from the emission regions. In connection with Auger processes, reference is also made to the documents: Jacques Peretti et al., "Identification of Auger effect as the dominant mechanism for efficiency droop of LEDs" in Proc. SPIE 9003, Light-Emitting Diodes: Materials, Devices, and Applications for Solid State Lighting XVIII, 90030Z (Feb. 27, 2014), and Laubsch et al., "On the origin of IQE-'droop' in InGaN LEDs" in Physica Status Solidi (C) Current Topics in Solid State Physics, Volume 6, Issue SUPPL. 2, July 2009, pages S913-S916, the disclosure content of which is hereby incorporated by reference.

Based on different growth rates on different crystal planes under typical MOVPE growth conditions during MQW growth, transport regions and emission regions can be deposited adjacently to one another in a lateral direction. The thicker quantum-well layers and barrier layers that are advantageous for efficient light generation are produced in the emission region here. In the transport regions, on the other hand, thinner barrier layers and thinner quantum-well layers are produced, which result in increased transport of holes into quantum-well layers that are located further away from the p-side.

Furthermore, the quantum-well layers particularly preferably have a low indium content, and thus a higher band gap, in the transport regions. Preferably, therefore, the charge carriers that are intercepted in the transport regions in the quantum-well layers will initially diffuse laterally in the continuously connected quantum-well layers into the more energetically favorable emission region with the lower band gap and will only recombine efficiently there, thus increasing the luminous efficiency of the semiconductor chip.

According to at least one embodiment, at least in the transport regions or only in a junction region between adjacent transport regions and emission regions, one or more doping layers is/are present, which is/are provided with a p-type dopant having an atomic concentration of at least $10^{17}$ 1/cm$^3$ or $10^{18}$ 1/cm$^3$ or, preferably, $10^{19}$ 1/cm$^3$. This at least one doping layer can be one or more of the quantum-well layers and/or barrier layers. Alternatively, the doping layer can be an additional layer, which partly or preferably completely fills the transport region and which can therefore lie above the thinner quantum-well layers and/or barrier layers along the growth direction. It is possible for the doping layer to take the form of a planarizing layer, such that the transport regions and emission regions are flush with one another as a result of the doping layer. In other words, the doping layer can also be present as a thinner layer above the active zone of the emission regions. The doping layer is preferably present in the entire transport regions, in particular as a covering layer of the quantum-well layers and/or the barrier layers of the transport regions. In particular, the doping layer partly or completely covers facets of the emission regions, especially where the transport regions are in the form of V-pits.

According to at least one embodiment, the proportion of surface area occupied by the emission regions is at least 50% or 70% or 80% or 90%. Alternatively or in addition, the proportion of surface area occupied by the emission regions, seen in a top view, is no more than 99% or 98% or 95% or 90%. A proportion of 100% of the surface area here corresponds to the sum of the surface areas of the emission regions and the transport regions.

According to at least one embodiment, seen in a top view of the multi-quantum-well structure, the emission regions appear brighter than the transport regions during operation. In other words, a generation of radiation takes place predominantly in the emission regions and to a lesser extent in the transport regions. Brightness here is to be understood in particular as the light intensity per unit of area, measured, e.g., in mW per µm$^2$. In particular, the emission regions appear brighter than the transport regions by at least a factor of 1.5 or 2 or 3 and/or by no more than a factor of 20 or 10 or 5, seen in a top view.

According to at least one embodiment, the transport regions have greater conductivity for holes than the emission regions in a direction parallel to the growth direction. The hole conductivity in the transport regions exceeds the hole conductivity in the emission regions, e.g., by a factor of at least 1.5 or 2 or 3 and/or by a factor of no more than 10 or 5. In other words, it is possible that a transport of holes within the multi-quantum-well structure in a direction parallel to the growth direction takes place predominantly in the transport regions.

According to at least one embodiment, the thicknesses of the quantum-well layers and/or barrier layers differ by a factor of at least 1.25 or 1.5 or 2 or 2.5 between the transport regions and the emission regions. Alternatively or in addition, the difference in the thicknesses of the quantum-well layers and/or barrier layers is a factor of no more than 15 or 10 or 6.

According to at least one embodiment, the transport regions have an average width, in a direction transverse or perpendicular to the growth direction, which is at least 100 nm or 250 nm or 500 nm or 0.7 µm. Alternatively or in addition, the average width of the transport regions is no more than 10 µm or 5 µm or 2.5 µm or 1 µm.

According to at least one embodiment, an average width of the emission regions, in a direction transverse or perpendicular to the growth direction and seen in cross-section, is at least twice or three times or six times the average width of the transport regions. Alternatively or in addition, the average width of the emission regions is no more than twenty times or ten times or five times the average width of the transport regions.

According to at least one embodiment, the multi-quantum-well structure is embedded in a semiconductor layer sequence, in particular between a p-type side and an n-type side of the semiconductor layer sequence.

The semiconductor layer sequence is preferably based on a III-V compound semiconductor material. The semiconductor material is, e.g., a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$, wherein in each case $0 \le n \le 1$, $0 \le m \le 1$ and $m+n \le 1$. The semiconductor layer sequence here can comprise dopants and additional constituents. For the sake of simplicity, however, only the essential constituents of the crystal lattice of the semiconductor layer sequence, i.e., Al, As, Ga, In, N or P, are specified, although these can be partly replaced and/or supplemented by small quantities of other substances.

According to at least one embodiment, the multi-quantum-well structure is based on the material system AlInGaN. In this case, the barrier layers preferably consist of GaN, InGaN and/or AlGaN. The barrier layers here can be doped or undoped. It is possible that the barrier layers each comprise multiple sub-layers composed of different materials, e.g., a sub-layer composed of InGaN and one or more further sub-layers composed of GaN. The quantum-well layers preferably consist of doped or undoped InGaN.

According to at least one embodiment, an average indium content of the quantum-well layers in the transport regions is no more than 60% or 50% or 35% of an average indium content of the quantum-well layers in the emission regions. The same can apply to the barrier layers where these comprise InGaN.

According to at least one embodiment, the number of quantum-well layers in the multi-quantum-well structure is at least four or eight or twelve. Alternatively or in addition, this number is no more than 50 or 25 or 16.

According to at least one embodiment, the transport regions or groups of transport regions are arranged regularly, seen in a top view. Associated with this, the emission regions or the one single emission region, seen in a top view, can be configured regularly. For example, seen in a top view, the transport regions are insular areas which are arranged in a rectangular or hexagonal lattice. Alternatively, it is also possible that the transport regions are arranged in an irregular manner, seen in a top view.

According to at least one embodiment, an average thickness of the quantum-well layers in the emission regions is at least 1.2 nm or 2.5 nm or 3 nm and/or no more than 15 nm or 12 nm or 8 nm or 6 nm. Alternatively or in addition, it is possible that an average thickness of the barrier layers in the emission regions is at least 3 nm or 5 nm or 7 nm and/or no more than 30 nm or 15 nm or 9 nm. The quantum-well layers and the barrier layers here are preferably thicker in the emission regions than in the transport regions in each case.

According to at least one embodiment, the transport regions and the emission regions each have the same number of quantum-well layers and barrier layers. In other words, in terms of the number of quantum-well layers and barrier layers, the multi-quantum-well structure is configured identically over the entire surface.

According to at least one embodiment, the quantum-well layers and/or the barrier layers are each oriented perpendicularly to the growth direction both in the transport regions and in the emission regions. In this case, all the quantum-well layers are preferably oriented parallel to one another. It is possible here that the quantum-well layers are not aligned perpendicularly to the growth direction in a junction region between adjacent transport regions and emission regions. An average width of the junction region, seen in cross-section, is in particular no more than 90% or 80% or 60% or, preferably, no more than 40% or 20% or, particularly preferably, no more than 10% or 5% of an average total width of the transport regions. The width specifications relate in each case to a direction transverse or perpendicular to the growth direction.

According to at least one embodiment, the transport regions together with the emission regions have an axis of symmetry perpendicular to the growth direction, seen in cross-section. In other words, the multi-quantum-well structure in this case is configured identically on both sides of and symmetrically to the axis of symmetry, within the limits of manufacturing tolerances, in particular in terms of the number, position and thickness of the quantum-well layers.

According to at least one embodiment, a first quantum-well layer is constructed identically in both the transport regions and the emission regions, seen along the growth direction, and lies within a single plane, seen in cross-section. It is possible that the transport regions and the emission regions also share more than one quantum-well layer in the same material composition and thickness. A quantum-well layer of this type can also be located in the middle of the transport regions or at an end of the transport regions, seen along the growth direction in each case.

According to at least one embodiment, the quantum-well layers and/or the barrier layers are triangular, arched, semicircular or trapezium-like in shape only in the transport regions, seen in cross-section. However, in the case of an angular shape, for instance, it is possible that rounded corners are present as a result of manufacturing tolerances but the basic shape is angular. The quantum-well layers and the barrier layers in the emission regions are preferably each aligned perpendicularly to the growth direction.

According to at least one embodiment, the transport regions have a central axis which is oriented parallel to the growth direction. Seen in cross-section, the central axis preferably forms an axis of symmetry of the transport regions. In other words, the transport regions, seen in cross-section, are divided by the central axis into two halves which are mirror images of one another across the central axis and are mirror symmetric.

According to at least one embodiment, a distance between adjacent quantum-well layers in the transport regions decreases monotonically or strictly monotonically towards the central axis of the transport regions. In other words, adjacent quantum-well layers become closer to one another towards the central axis.

According to at least one embodiment, the quantum-well layers in the emission regions are oriented parallel to one another. The quantum-well layers can also be uniformly distributed along the growth direction in the emission regions, such that a distance between adjacent quantum-well layers in the emission regions does not vary but is constant.

According to at least one embodiment, the quantum-well layers in at least some or in all of the transport regions are shaped as elevations relative to the emission regions. In other words, along the growth direction the quantum-well layers in the transport regions project beyond the quantum-well layers in the emission regions in this case. Expressed another way, the quantum-well layers in the transport regions protrude compared with the quantum-well layers in the emission regions, relative to the growth direction.

According to at least one embodiment, the quantum-well layers in at least some or in all of the transport regions are shaped as sinks relative to the emission regions. The parts of the respective quantum-well layer that are located in these transport regions are therefore set back compared with the parts of the corresponding quantum-well layer in the emission regions, seen along the growth direction.

According to at least one embodiment, the transport regions each run through the active zone completely along the growth direction. In this case, the transport regions preferably do not comprise a quantum-well layer which is also found in the emission regions in the same thickness and material composition and position along the growth direction.

According to at least one embodiment, the transport regions run through the multi-quantum-well structure only partly, seen along the growth direction. The transport regions in this case preferably occupy at least 75% or 50% or 25% of the multi-quantum-well structure and/or the active zone, seen along the growth direction. In this case, therefore, one or more of the quantum-well layers can be present continuously in the emission regions and the transport regions in unmodified thickness, position and/or material composition, seen in cross-section.

According to at least one embodiment, the transport regions have a varying width. In other words, at various points along the growth direction, different widths are present in the transport regions. The width relates to an extension of the transport regions in a direction transverse or perpendicular to the growth direction.

According to at least one embodiment, the width of the transport regions increases in a direction towards the middle of the active zone and/or the multi-quantum-well structure, seen along the growth direction. In other words, along the growth direction the transport regions in this case have a greater width in the middle of the active zone than at an edge of the active zone.

According to at least one embodiment, the optoelectronic semiconductor chip comprises a substrate. The substrate is preferably the mechanically supporting and stabilizing component of the semiconductor chip.

According to at least one embodiment, the substrate is a growth substrate for the semiconductor layer sequence, the active zone and the multi-quantum-well structure. In particular, the semiconductor layer sequence is epitaxially grown directly on to the substrate.

According to at least one embodiment, the substrate is different from a growth substrate. In other words, the semiconductor layer sequence in this case was epitaxially grown on to a growth substrate and this growth substrate was then removed from the semiconductor layer sequence and the active zone.

According to at least one embodiment, the substrate has a patterned substrate surface on which the semiconductor layer sequence and the active zone are grown. In particular, the subdivision of the multi-quantum-well structure into the transport regions and the emission regions is defined by the patterning of the substrate surface. For example, seen in a top view, the emission regions are located above plateau-shaped, flat regions of the substrate surface and the transport regions are located on sloping flanks and/or elevations and/or sinks on the substrate surface. The emission regions here can be formed in trenches or on elevations of the substrate surface. It is possible here that a contour of the quantum-well layers, seen in cross-section, reproduces or at least approximately reproduces a contour of the substrate surface. An exact reproduction is not necessarily required, provided that a basic shape of the contour of the substrate surface corresponds to a basic shape of the respective quantum-well layer.

According to at least one embodiment, a gradient is present in a material composition, a thickness and/or a layer thickness of the quantum-well layers and/or the barrier layers. This gradient preferably extends over more than one of the quantum-well layers and/or barrier layers and is present in particular in a direction parallel to the growth direction. For example, the thickness of the quantum-well layers decreases along the growth direction and/or the indium content of the quantum-well layers increases along the growth direction. The same can apply to dopings of the barrier layers and/or quantum-well layers. As a result of such a gradient, it is possible in particular that the quantum-well layers differ in terms of their emission wavelength along the growth direction. For example, quantum-well layers located closer to the n-side of the semiconductor layer sequences emit shorter-wave radiation.

BRIEF DESCRIPTION OF THE DRAWINGS

An optoelectronic semiconductor chip as described here is explained in more detail below with reference to the drawing with the aid of exemplary embodiments. The same reference signs relate to the same elements in the individual figures here. However, relationships are not shown to scale; rather, to aid understanding, the size of individual elements may be exaggerated.

The figures show the following:

FIGS. 2 to 11 and 17 to 19 show cross-sectional diagrams of exemplary embodiments of multi-quantum-well structures for optoelectronic semiconductor chips.

DETAILED DESCRIPTION OF ILLUSTRATIVE EMBODIMENTS

Figure 1:
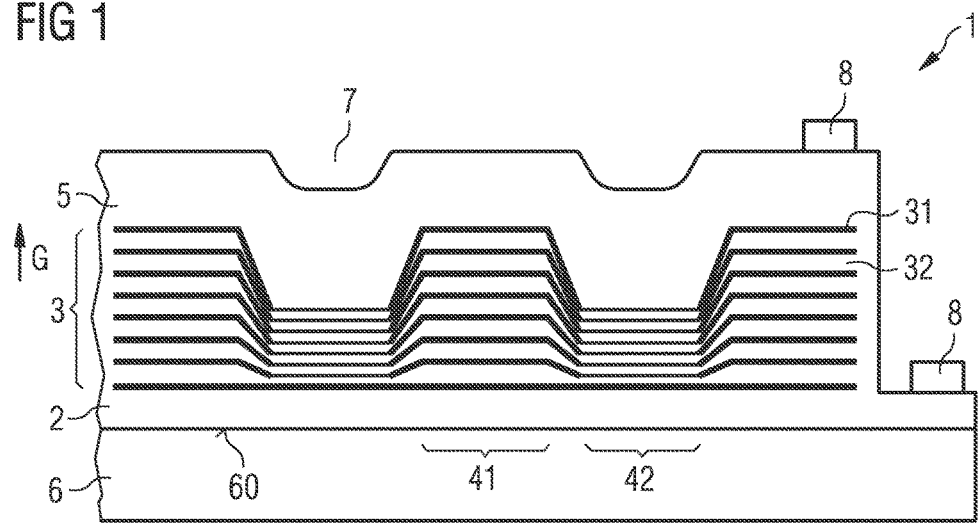
FIGS. 1, 12 and 13 show cross-sectional diagrams of exemplary embodiments of optoelectronic semiconductor chips.

In FIG. 1, an exemplary embodiment of an optoelectronic semiconductor chip 1 is shown. The semiconductor chip 1 comprises a substrate 6, on the substrate surface 60 of which a semiconductor layer sequence is grown. The semiconductor layer sequence is preferably based on AlInGaN.

The semiconductor layer sequence comprises an n-doped side 2 and a p-doped side 5. Between these doped sides 2, 5 there is a multi-quantum-well structure 3, which represents an active zone of the semiconductor chip 1. Contact metallizations 8 for an electrical contacting of the semiconductor chip 1 are located on both the n-doped side 2 and the p-doped side 5. To simplify the illustration, optional current distribution structures are not shown. A growth direction G of the semiconductor layer sequence points away from the substrate 6 in a direction towards the p-doped side 5.

The multi-quantum-well structure 6 comprises alternating quantum-well layers 31 and barrier layers 32. The quantum-well layers 31 and the barrier layers 32 extend continuously over the entire active zone without any interruptions or gaps being formed intentionally. However, the quantum-well layers 31 and/or the barrier layers 32 are modulated in terms of their thickness.

Thus, regions with a greater thickness of the quantum-well layers 31 and/or barrier layers 32 are present. These regions form emission regions 41 in which light generation primarily takes place. Furthermore, transport regions 42 are present in which the quantum-well layers 31 and/or the barrier layers 32 are thinner in form. Transport primarily takes place in the transport regions 42, of holes in particular, in a direction parallel to the growth direction G and in quantum-well layers 31 which are close to the n-doped side 2.

From the transport regions 42, charge carriers are further distributed into the emission regions 41 in a direction perpendicular to the growth direction G. In other words, the energy levels of the quantum-well layers 31 in the emission regions 41 and the transport regions 42 are adjusted such that charge carrier recombination takes place primarily in the emission regions 41. As a result, seen in a top view, the emission regions 41 appear brighter than the transport regions 42.

According to FIG. 1, the quantum-well layer 31 closest to the substrate 6 is identical in form, i.e., is present in unvarying thickness and material composition, over the emission regions 41 and the transport regions 42. As a result of the thinner barrier layers 32 and/or quantum-well layers 31 in the transport regions 42, the individual layers in the transport regions 42 have a trapezium-like, symmetrical shape, seen in cross-section. A patterning into the transport regions 42 and the emission regions 41 takes place, e.g., as a result of the presence of different growth rates on different crystal planes and/or of the local modification of a growth temperature, for instance by irradiation with laser light. Lithographic or self-assembling masking techniques can also be used.

Light outcoupling structures 7 are optionally formed on a side of the semiconductor layer sequence. It is possible that the light outcoupling structures 7 are spatially correlated with the transport regions 42. The same is also possible in all the other exemplary embodiments.

Figure 2:
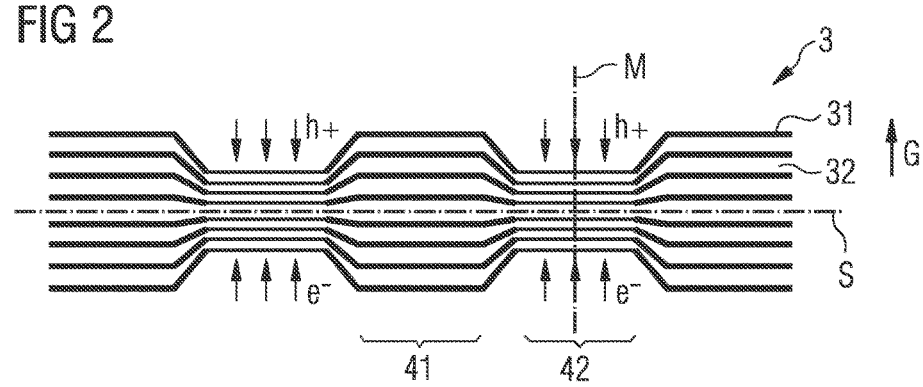

In the exemplary embodiment as seen in FIG. 2, the quantum-well layers 31 are formed symmetrically about an axis of symmetry S, the axis of symmetry S being aligned perpendicularly to the growth direction G. The transport of charge carriers is symbolized by arrows, with h⁺ denoting holes and e⁻ denoting electrons.

Optionally, as in all the other exemplary embodiments, it is possible that the transport regions 42 each have a central axis M. The central axis M is oriented parallel to the growth direction G. Seen in cross-section, the transport regions 42 are preferably constructed symmetrically about the central axis M.

In the exemplary embodiment of FIG. 3, in the transport regions 42 the barrier layers 32 and the quantum-well layers 31 are each triangular in shape. According to FIG. 4, the quantum-well layers 31 and the barrier layers 32 have an arched shape, seen in cross-section.

In a direction towards the middle of the transport regions 42, according to FIGS. 3 and 4, the distance between adjacent quantum-well layers 31 decreases. The smallest distance between adjacent quantum-well layers 31 is in the region of the central axis M.

According to FIG. 5, the quantum-well layers 31 and the barrier layers 32 in the transport regions 42 are likewise triangular in shape, seen in cross-section. The quantum-well layers 31 here are arranged equidistant to one another within the region 42, and therefore the distance between adjacent quantum-well layers 31 remains constant or approximately constant over the entire width of the transport regions 42. The same can also apply to arched or trapezium-shaped embodiments, see, e.g., in particular FIGS. 1 and 4.

As can be seen in FIG. 6, the quantum-well layers 31 can be in the form of elevations in the transport regions 42, relative to the quantum-well layers 31 in the emission regions 41 and with reference to the growth direction G. Otherwise, the transport regions 42 of FIG. 6 are formed in exactly the same way as the transport regions 42 in FIG. 5.

The quantum-well layers 31 according to FIGS. 1, 3 and 4 can also, unlike the illustrations in these figures, be configured as elevations similar to those in FIG. 6.

In FIGS. 2 to 6, the modified layers 31, 32 in the transport regions 42 each extend through the multi-quantum-well structure 3 completely along the growth direction G. In the exemplary embodiment as illustrated in FIG. 7, only some of the quantum-well layers 31 are thinner in the transport regions 42, and therefore trapezium-shaped. More than one of the quantum-well layers 31 extend in unmodified and constant thickness both over the emission regions 41 and over the sections with the thinner quantum-well layers 31. Along the growth direction G, the actual transport region 42 extends approximately 40% of the way through the multi-quantum-well structure 3. The same can apply to quantum-well layers 31 that are shaped similarly to those in FIGS. 3 to 6.

As illustrated in FIG. 7 with the aid of the reference signs, transport regions 42 are understood to be those sections of the multi-quantum-well structure 3 comprising quantum-well layers 31 and/or barrier layers 32 that have been at least partly modified in a direction parallel to the growth direction G, since in these sections improved charge carrier conductivity is achieved in a direction parallel to the growth direction G.

In the exemplary embodiment as illustrated in FIG. 8, the quantum-well layers 31 have a variable thickness in the transport regions 42. Against the growth direction G, the width of the quantum-well layers 31 decreases in the transport regions 42. Differing from the illustration, it is also possible here that the transport regions 42 pass through the quantum well structure 3 completely in a direction along the growth direction G.

In the exemplary embodiment as illustrated in FIG. 9, the width of the quantum-well layers 31 increases in the transport regions 42 in a direction towards the middle of the quantum well structure 3. Deviating from the illustration in FIG. 9, it is possible that the widest of the quantum-well layers 31 in the transport regions 42 is located not in the middle of the quantum well structure 3 along the growth direction G but, e.g., in a lower quarter or a lower third, seen along the growth direction G. In other words, the transport regions 42 pass, e.g., ⅘ or ¾ or ⅔ of the way through the quantum well structure 3 in this case and the quantum-well layer 31 of the transport regions 42 lying furthest away within the quantum well structure 3 then has the greatest thickness, starting from a side of the multi-quantum-well structure 3. As in all the other exemplary embodiments, the transport regions 42 preferably start on a side of the multi-quantum-well structure 3 facing towards the p-doped side of the semiconductor layer sequence, but can also start on an n-doped side.

Figure 10:
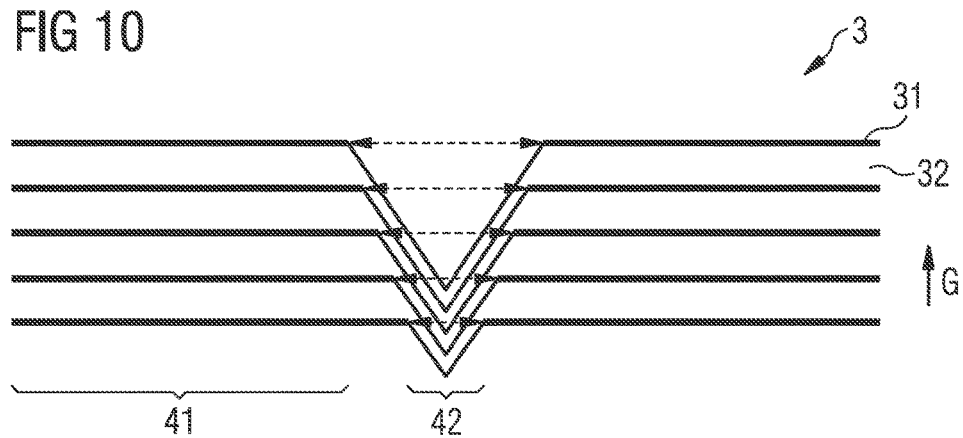

It is shown in FIG. 10 that the quantum-well layers 31 in the transport regions 42 are triangular in shape, seen in cross-section. Along the growth direction G here, the width of the quantum-well layers 31 increases in the transport regions 42, e.g., in a linear fashion.

The number of quantum-well layers 31 is, e.g., at least 5 or 7 and/or no more than 9 or 15. The thicknesses of the quantum-well layers 31 are preferably between 2 nm and 4 nm inclusive, in particular approx. 3 nm, in the emission regions 41 and between 0.25 nm and 3 nm inclusive, in particular approx. 1 nm, in the transport regions 42. The quantum-well layers 31 preferably consist of InGaN with an indium content of between 6% and 25% inclusive, in particular approx. 12%, in the emission regions 41 and with an indium content of between 2% and 15% inclusive, in particular approx. 3%, in the transport regions 42. The thicknesses of the barrier layers 32 are preferably between 3 nm and 15 nm inclusive, in particular approx. 9 nm, in the emission regions 41 and between 0.5 nm and 8 nm inclusive, in particular approx. 3 nm, in the transport regions 42. The transport regions 42 can have an average diameter of between 50 nm and 800 nm inclusive or 80 nm to 400 nm, in particular approx. 200 nm. The transport regions 42 preferably occupy a proportion of the surface area of between 2% and 20% inclusive, in particular approx. 6%, seen in a top view. These values preferably also apply to all the other exemplary embodiments.

Figure 11:
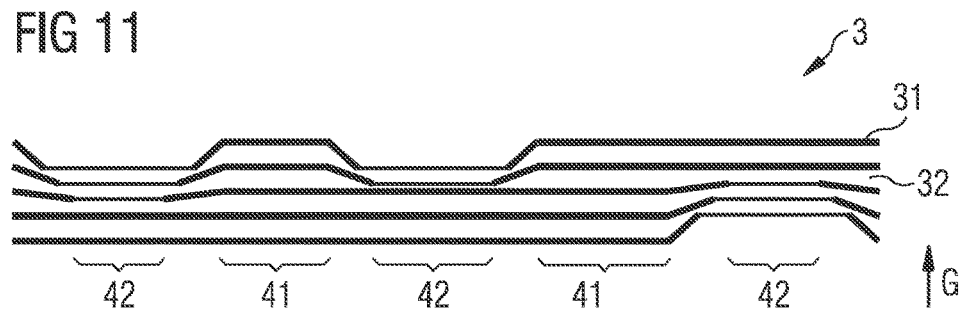

It is illustrated in FIG. 11 that multiple different types of transport regions 42 can be combined with one another within a quantum well structure 3. It is also possible here that a relatively small proportion of the transport regions 42 start on an n-doped side. Deviating from the illustration according to FIG. 11, different structures can also be combined with one another, e.g., triangular-shaped quantum-well layers 31, seen in cross-section, from FIG. 5, 6 or 10 with trapezium-shaped quantum-well layers 31, for instance from FIGS. 7 to 9, with arch-shaped quantum-well layers 31, for instance from FIG. 4.

Figure 12:
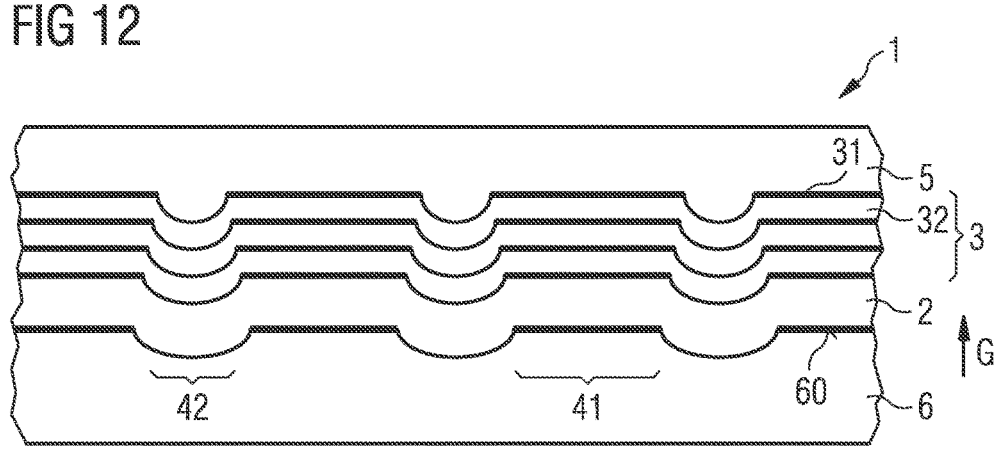

In the semiconductor chip 1 as shown in FIG. 12, the substrate 6 has a patterned substrate surface 60. The emission regions 41 and the transport regions 42 are defined by the patterning of the substrate surface 60. The quantum-well layers 31 have the same contour as the substrate surface 60, seen in cross-section. The emission regions 41 here are defined by regions of the substrate surface 60 that run perpendicular to the growth direction G and are shaped like a plateau. A corresponding shaping of the quantum-well layers 31 in the transport regions 42 can also take place in all the other exemplary embodiments.

Figure 13:
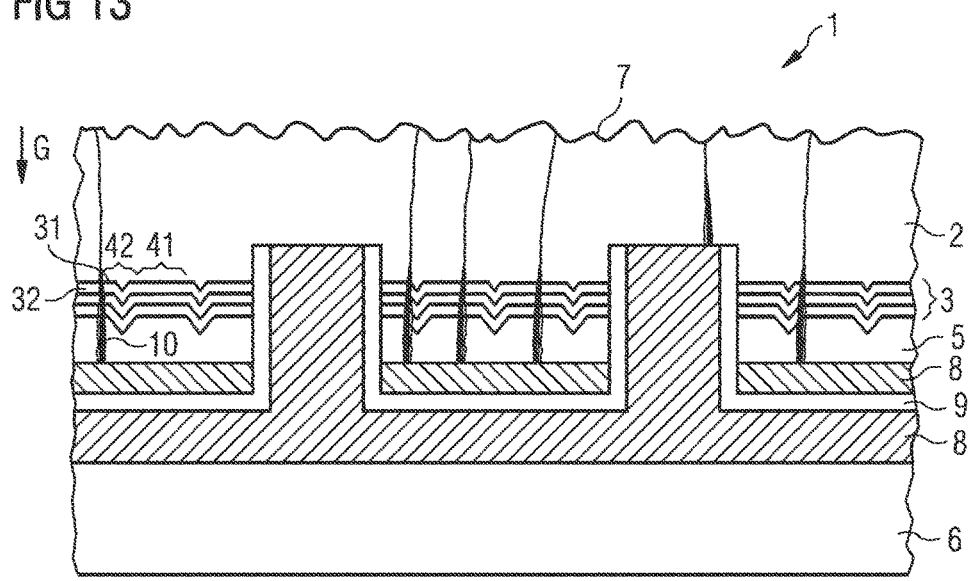

In FIG. 13, a further exemplary embodiment of the semiconductor chip 1 is illustrated. An electrical contacting here is formed as specified in the document US 2010/0171135 A1, the disclosure content of which is incorporated by reference. Thus, contacting also takes place by means of contact regions, which run from the p-side 5 through the multi-quantum-well structure 3 into the n-side 2. These vias through the multi-quantum-well structure 3 preferably have a significantly greater width than the transport regions 42, e.g., a width which is greater by at least a factor of 5 or 10 or 20.

Furthermore, FIG. 13 shows a diagram of crystal defects 10 in the form of so-called V-pits. These V-pits are described, e.g., in the document Cho et al. in the Journal of the Korean Physical Society, vol. 42, February 2003, pages S547 to S550. As a result of these V-pits 10, it is possible that the quantum-well layers 31 in the multi-quantum-well structure 3 are locally dislocated. However, these V-pits 10 are preferably not present in spatial correlation with the transport regions 42 but are randomly distributed. Furthermore, spatial dimensions of the V-pits 10 are preferably smaller than the dimensions of the transport regions 42 by a factor of at least 2 or 5 in a direction perpendicular to the growth direction G, but are greater along parallel to the growth direction G. The V-pits 10 can also widen in a direction towards the p-side 5, contrarily to the quantum-well layers 31 in the transport regions 42. Deviating from the illustration in FIG. 13, however, it is also possible that the V-pits 10 and the transport regions 42 both widen in a direction towards the p-side, seen in cross-section.

Figure 14A:
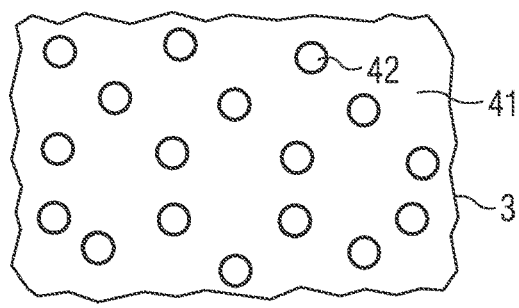
FIGS. 14A-14D show a top-view diagram of an exemplary embodiment of a multi-quantum-well structure for optoelectronic semiconductor chips.
Figure 14B:
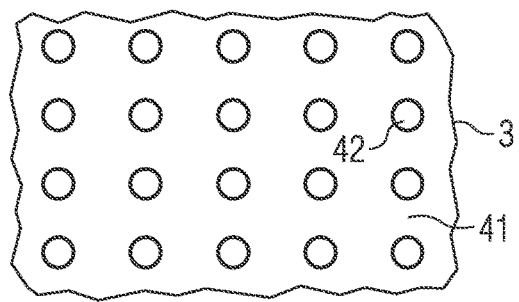

In the top view according to FIG. 14A, it is shown that the transport regions 42 are insular and can be arranged in a hexagonal lattice. According to FIG. 14B, the transport regions 42 are arranged regularly in a rectangular lattice.

Figure 14C:
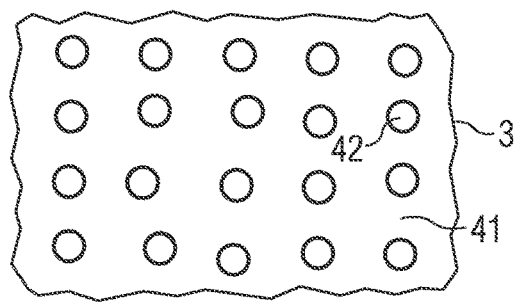
Figure 14D:
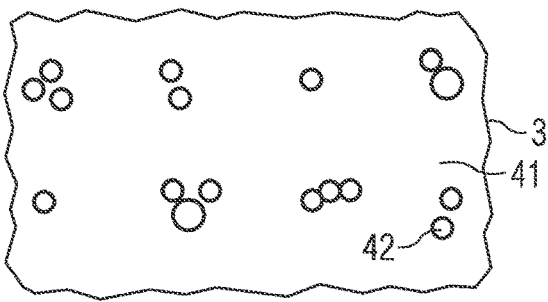

The arrangement of the transport regions 42 in FIGS. 14C and 14D likewise takes place in a regular pattern. As can be seen in FIG. 14C, however, the individual transport regions 42 can be shifted slightly relative to a pure rectangular lattice, e.g., on average by no more than 30% or 20% of a lattice constant. In FIG. 14D, it is shown that the transport regions 42 are arranged around lattice points of a regular lattice, which is in particular a rectangular lattice. In this case, for example, between 1 and 5 inclusive of the transport regions 42 closely surround a lattice point, e.g., in a radius of no more than 20% or 10% of the lattice constant.

A corresponding arrangement of the transport regions 42, seen in a top view, can likewise be present in all the other exemplary embodiments.

Figure 16:
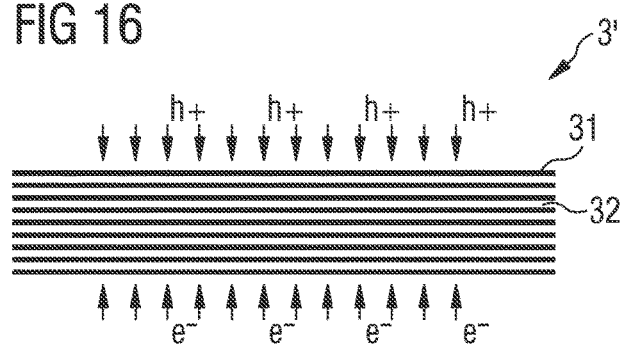
FIG. 16 shows a cross-sectional diagram of a conventional multi-quantum-well structure.

In FIG. 16, a conventional multi-quantum-well structure 3' is shown. In this case, the thickness of the quantum-well layers 31 and barrier layers 32 is not modulated, so that charge carriers $h^+$, $e^-$ are pushed uniformly into the multi-quantum-well structure 3' over the entire surface.

Figure 15:
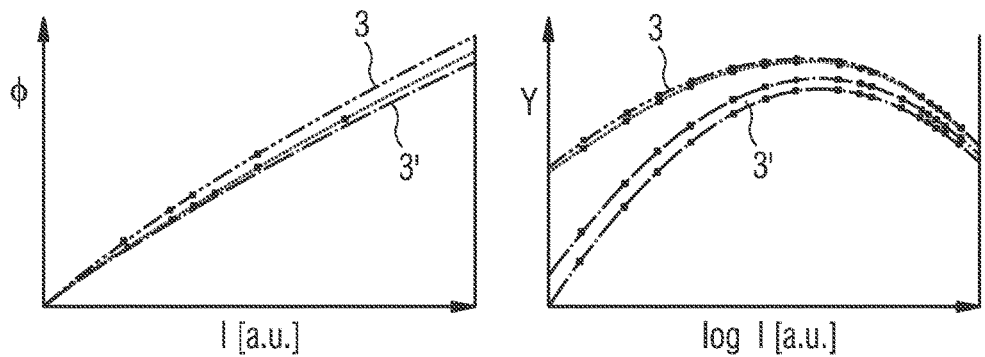
FIG. 15 shows a schematic curve of current versus luminous flux and external quantum efficiency of semiconductor chips.

Compared with a conventional multi-quantum-well structure 3' of this type, the multi-quantum-well structures 3 of FIGS. 1 to 14 are improved in terms of a luminous flux Φ and an external quantum efficiency Y, see, e.g., FIG. 15. FIG. 15 shows a dependence of the luminous flux Φ on an operating current I and a dependence of the external quantum efficiency Y, plotted against the logarithm of the operating current I.

Figure 17:
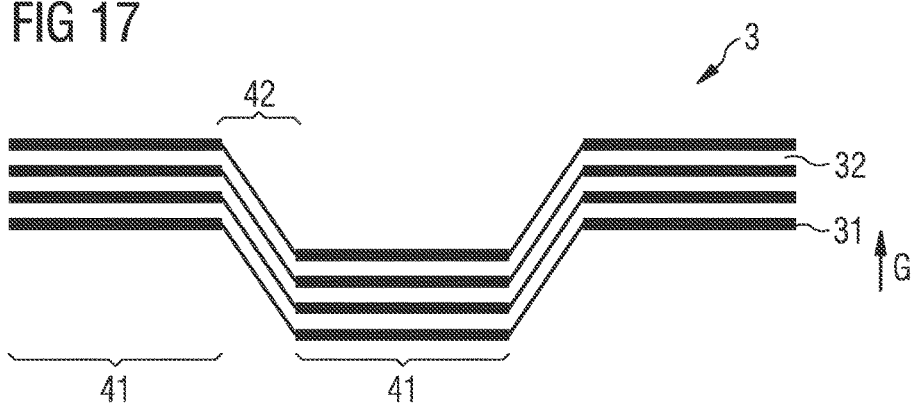

In the exemplary embodiment of FIG. 17, adjacent emission regions 41, seen in cross-section, are arranged offset to one another along the growth direction G. Between adjacent emission regions 41 there is a transport region 42 in each case, which runs obliquely to the growth direction G.

Figure 18:
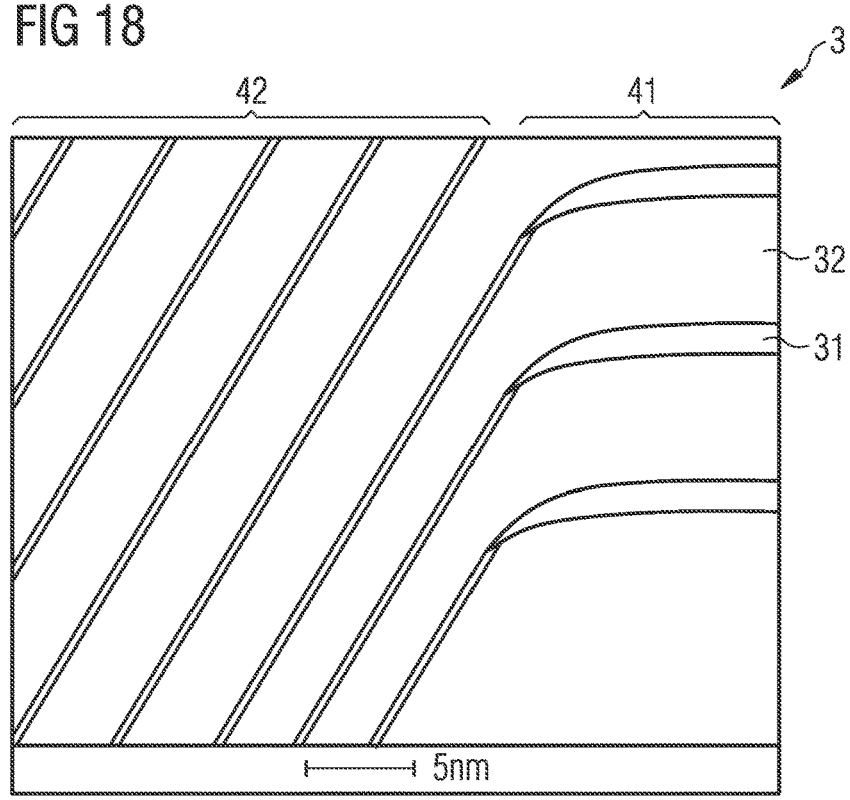
Figure 19:
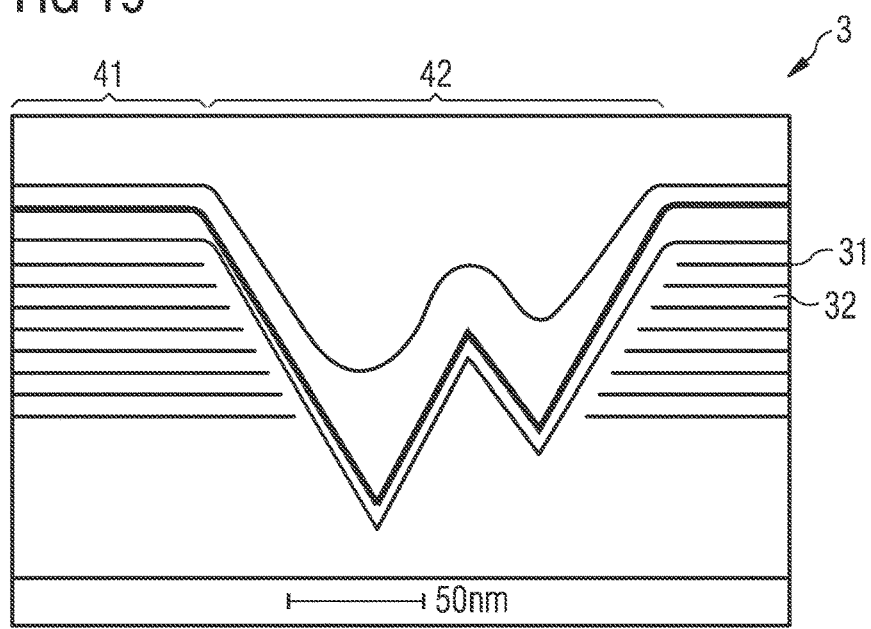

In FIGS. 18 to 19, transmission electron microscope images of exemplary embodiments of semiconductor chips 1 are shown. The quantum-well layers 31 here appear brighter than the barrier layers 32.

According to FIG. 18, the quantum-well layers 31 in the emission region 41 are significantly thicker in form than in the transport region 42. The quantum-well layers 31 are not interrupted in a junction region between the emission region 41 and the transport region 42.

FIG. 19 shows that in the transport region 42, seen in cross-section, a twin structure composed of two triangles can be present.

The description with the aid of the exemplary embodiments does not limit the invention described here thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. An optoelectronic semiconductor chip comprising:
    an active zone with a multi-quantum-well structure based on AlInGaN,
    wherein the multi-quantum-well structure comprises multiple quantum-well layers and multiple barrier layers, which are arranged sequentially in an alternating manner along a growth direction and which each extends continuously over the entire multi-quantum-well structure,
    wherein the multi-quantum-well structure has at least one emission region and multiple transport regions, which are arranged sequentially in an alternating manner in a direction perpendicular to the growth direction,
    wherein at least one of the quantum-well layers and the barrier layers are thinner in the transport regions than in the emission regions,
    wherein the quantum-well layers in the transport regions and in the emission regions are oriented perpendicularly to the growth direction, with exception of a transition region between adjacent transport regions and emission regions,
    wherein an average indium content of the quantum-well layers in the transport regions is no more than 60% of an average indium content of the quantum-well layers in the emission regions so that the quantum-well layers have a higher band gap in the transport regions than in the emission regions, and
    wherein the transition region has an average width of no more than 20% of an average total width of the transport regions in a direction perpendicular to the growth direction.

2. The optoelectronic semiconductor chip according to claim 1,
    wherein, seen in a top view, a proportion of a surface area occupied by the emission regions is between 70% and 98% inclusive,
    wherein the emission regions, seen in the top view, appear brighter than the transport regions by at least a factor of 3 during operation,
    wherein a thicknesses of at least one of the quantum-well layers and the barrier layers differ from one another by at least a factor of 1.5 and by no more than a factor of 10 between the transport regions and the emission regions, wherein an average width of the transport regions is between 250 nm and 5 µm transverse to the growth direction, wherein the barrier layers comprise one of GaN, InGaN and AlGaN and the quantum-well layers consist essentially of InGaN, wherein a number of quantum-well layers is between 4 and 25 inclusive, wherein, seen in the top view, the transport regions and the emission regions are arranged in a regular manner, wherein an average thickness of the quantum-well layers in the emission regions is between 1.2 nm and 15 nm inclusive, wherein the average indium content of the quantum-well layers in the transport regions is no more than 50% of an average indium content of the quantum-well layers in the emission regions, and wherein, in the transport regions and in the emission regions, the same number of quantum-well layers and barrier layers is present.

3. The optoelectronic semiconductor chip according to claim 1, wherein the transport regions together with the emission regions, seen in cross-section, exhibit an axis of symmetry perpendicular to the growth direction.

4. The optoelectronic semiconductor chip according to claim 1, wherein a first quantum-well layer, seen in the growth direction, is constructed identically both in the transport regions and in the emission regions and lies in a single plane.

5. The optoelectronic semiconductor chip according to claim 1, wherein, in the transport regions, a distance between adjacent quantum-well layers decreases monotonically or strictly monotonically towards a central axis of the transport regions, and wherein the central axis is an axis of symmetry of the transport regions and is oriented parallel to the growth direction.

6. The optoelectronic semiconductor chip according to claim 1, wherein the quantum-well layers are oriented parallel to one another in the emission regions and in the transport regions.

7. The optoelectronic semiconductor chip according to claim 1, wherein the quantum-well layers are shaped as elevations in at least some of the transport regions, relative to the emission regions, such that parts of the quantum-well layer that are located in these transport regions project beyond the parts of the corresponding quantum-well layer in the emission regions along the growth direction.

8. The optoelectronic semiconductor chip according to claim 1, wherein the quantum-well layers are shaped as sinks in at least some of the transport regions, relative to the emission regions, such that parts of the quantum-well layer that are located in these transport regions are set back relative to the parts of the corresponding quantum-well layer in the emission regions along the growth direction.

9. The optoelectronic semiconductor chip according to claim 1, wherein the transport regions run through the active zone completely along the growth direction.

10. The optoelectronic semiconductor chip according to claim 1, wherein the transport regions run only partly but at least 50% through the active zone along the growth direction.

11. The optoelectronic semiconductor chip according to claim 1, wherein the transport regions have a varying width along the growth direction.

12. The optoelectronic semiconductor chip according to claim 11, wherein the width of the transport regions increases in a direction towards a middle of the active zone, seen along the growth direction.

13. The optoelectronic semiconductor chip according to claim 1, further comprises a growth substrate for the active zone, wherein the substrate has a patterned substrate surface, and wherein a subdivision into the transport regions and the emission regions is defined by the patterned substrate surface.

14. The optoelectronic semiconductor chip according to claim 1, wherein at least one of a material composition and a layer thickness is varied over more than one of at least one of the quantum-well layers and the barrier layers.

15. An optoelectronic semiconductor chip comprising:

an active zone with a multi-quantum-well structure based on AlInGaN, wherein the multi-quantum-well structure comprises multiple quantum-well layers and multiple barrier layers, which are arranged sequentially in an alternating manner along a growth direction and which each extends continuously over the entire multi-quantum-well structure, wherein the multi-quantum-well structure has at least one emission region and multiple transport regions, which are arranged sequentially in an alternating manner in a direction perpendicular to the growth direction, wherein at least one of the quantum-well layers and the barrier layers are thinner in the transport regions than in the emission regions, wherein the quantum-well layers in the transport regions and in the emission regions are oriented perpendicularly to the growth direction, with exception of a transition region between adjacent transport regions and emission regions, wherein an average indium content of the quantum-well layers in the transport regions is no more than 60% of an average indium content of the quantum-well layers in the emission regions so that the quantum-well layers have a higher band gap in the transport regions than in the emission regions, wherein, seen in a top view, a proportion of a surface area occupied by the emission regions is between 70% and 98% inclusive, wherein the emission regions, seen in the top view, appear brighter than the transport regions by at least a factor of 3 during operation, wherein a thicknesses of at least one of the quantum-well layers and the barrier layers differ from one another by at least a factor of 1.5 and by no more than a factor of 10 between the transport regions and the emission regions, wherein an average width of the transport regions is between 250 nm and 5 µm transverse to the growth direction, wherein the barrier layers comprise one of GaN, InGaN or AlGaN wherein the quantum-well layers consist essentially of InGaN, wherein a number of quantum-well layers is between 4 and 25 inclusive, wherein, seen in the top view, the transport regions and the emission regions are arranged in a regular manner, wherein an average thickness of the quantum-well layers in the emission regions is between 1.2 nm and 15 nm inclusive, wherein the average indium content of the quantum-well layers in the transport regions is no more than 50% of an average indium content of the quantum-well layers in the emission regions, and wherein, in the transport regions and in the emission regions, the same number of quantum-well layers and barrier layers is present.

16. An optoelectronic semiconductor chip comprising:

an active zone with a multi-quantum-well structure based on AlInGaN, wherein the multi-quantum-well structure comprises multiple quantum-well layers and multiple barrier layers, which are arranged sequentially in an alternating manner along a growth direction and which each extends continuously over the entire multi-quantum-well structure, wherein the multi-quantum-well structure has at least one emission region and multiple transport regions, which are arranged sequentially in an alternating manner in a direction perpendicular to the growth direction, wherein at least one of the quantum-well layers and the barrier layers are thinner in the transport regions than in the emission regions, wherein the quantum-well layers in the transport regions and in the emission regions are oriented perpendicularly to the growth direction, with exception of a transition region between adjacent transport regions and emission regions, wherein an average indium content of the quantum-well layers in the transport regions is no more than 60% of an average indium content of the quantum-well layers in the emission regions so that the quantum-well layers have a higher band gap in the transport regions than in the emission regions, and wherein the transport regions run only partly but at least 50% through the active zone along the growth direction.

* * * * *